(12) United States Patent
Otsubo

(10) Patent No.: US 8,912,874 B2
(45) Date of Patent: Dec. 16, 2014

(54) MONOLITHIC CERAMIC ELECTRONIC COMPONENT AND PRODUCING METHOD THEREFOR

(71) Applicant: Murata Manufacturing Co., Ltd., Kyoto (JP)

(72) Inventor: Yoshihito Otsubo, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 13/727,253

(22) Filed: Dec. 26, 2012

(65) Prior Publication Data

US 2013/0113595 A1    May 9, 2013

Related U.S. Application Data

(63) Continuation of application No. PCT/JP2011/063331, filed on Jun. 10, 2011.

(30) Foreign Application Priority Data

Jun. 28, 2010   (JP) ................................. 2010-145796

(51) Int. Cl.
| | |
|---|---|
| H01F 5/00 | (2006.01) |
| H01F 27/28 | (2006.01) |
| H01F 27/24 | (2006.01) |
| H01F 27/29 | (2006.01) |
| H01F 17/00 | (2006.01) |
| H01F 41/04 | (2006.01) |
| H05K 1/16 | (2006.01) |
| H05K 3/46 | (2006.01) |

(52) U.S. Cl.
CPC ........ H01F 27/2804 (2013.01); H01F 17/0013 (2013.01); *H05K 3/4629* (2013.01); H01F 41/041 (2013.01); *H05K 1/165* (2013.01)

USPC .......... 336/200; 336/232; 336/234; 336/192; 336/225

(58) Field of Classification Search
CPC ............ H01F 27/2804; H01F 17/0013; H01F 17/0033; H01F 5/003; H01F 41/041
USPC .......................... 336/200, 232, 234, 192, 225
See application file for complete search history.

(56) References Cited

U.S. PATENT DOCUMENTS 7,375,977 B2 *  5/2008  Maeda et al. ................. 361/763
2002/0102406 A1 *  8/2002  Muthiah ....................... 428/413

(Continued)

FOREIGN PATENT DOCUMENTS

| JP | 58-010810 A | 1/1983 |
|---|---|---|
| JP | 63-044286 B | 9/1988 |

(Continued)

OTHER PUBLICATIONS

International Search Report; PCT/JP2011/063331; Sep. 13, 2011.

(Continued)

*Primary Examiner* — Alexander Talpalatski
*Assistant Examiner* — Kazi Hossain
(74) *Attorney, Agent, or Firm* — Studebaker & Brackett PC

(57) ABSTRACT

A monolithic ceramic electronic component including coil conductors is capable of reducing the number of stacked ceramic layers without sacrifice of the performance of coils and be capable of increasing the number of turns of the coils without increasing the size in. In the monolithic ceramic electronic component, coil conductors having more than one turn for one ceramic layer are formed. The coil conductors include surface coil conductors that are located along surfaces of sequentially stacked ceramic layers and intra-layer coil conductors that are located inside the ceramic layers so as not to extend beyond the thickness of the individual ceramic layers. The surface coil conductors and the intra-layer coil conductors are connected in series with connecting portions therebetween.

8 Claims, 13 Drawing Sheets

(56) References Cited

U.S. PATENT DOCUMENTS

| | | |
|---|---|---|
| 2005/0077993 A1* | 4/2005 | Kanno et al. .................. 336/223 |
| 2007/0180684 A1* | 8/2007 | Wada et al. .................. 29/602.1 |
| 2008/0012679 A1* | 1/2008 | Okabe et al. .................. 336/200 |
| 2010/0127812 A1* | 5/2010 | Maeda .......................... 336/200 |
| 2011/0187486 A1* | 8/2011 | Sugiyama et al. ............ 336/200 |

FOREIGN PATENT DOCUMENTS

| | | | |
|---|---|---|---|
| JP | 01-151211 A | 6/1989 | |
| JP | 10-012455 A | 1/1998 | |
| JP | 2001313211 | * 11/2000 | ............. H01F 17/00 |
| JP | 2001-313211 A | 11/2001 | |
| JP | 2004-186312 A | 7/2004 | |
| JP | 2006-261577 A | 9/2006 | |
| WO | WO 2010-050306 | * 5/2010 | |

OTHER PUBLICATIONS

Written Opinion of the International Searching Authority; PCT/JP2011/063331; Sep. 13, 2011.

* cited by examiner

MONOLITHIC CERAMIC ELECTRONIC COMPONENT AND PRODUCING METHOD THEREFOR

CROSS REFERENCE TO RELATED APPLICATIONS

The present application is a continuation of International Patent Application No. PCT/2011/063331 filed on Jun. 10, 2011, and claims priority to Japanese Patent Application No. 2010-145796 filed Jun. 28, 2010, the entire contents of each of these applications being incorporated herein by reference in their entirety.

TECHNICAL FIELD

The technical field relates to a monolithic ceramic electronic component and a producing method therefor, and more particularly, to a monolithic ceramic electronic component including a coil conductor and a producing method therefor.

BACKGROUND

Monolithic coil components, for example, as described in Japanese Examined Patent Application Publication No. 63-44286 (Patent Document 1), are a typical example of monolithic ceramic electronic components including therein a coil conductor extending in a coil shape. In the case of producing a monolithic coil component, a step of producing an unfired component body by forming a coil conductor on a surface of a magnetic or insulating ceramic green sheet, stacking a plurality ceramic green sheets in such a manner that one end of the coil conductor is connected to another coil conductor via a hole arranged in the ceramic green sheet and press-bonding the plurality of ceramic green sheets; and a step of firing the unfired component body are performed. The above-mentioned coil conductors are formed on surfaces of ceramic green sheets by printing using conductive paste.

Thus, according to the technique described in Patent Document 1, in the unfired component body, there are differences in thickness and density between a portion of a ceramic green sheet where a coil conductor is formed and a portion of the ceramic green sheet where a coil conductor is not formed. When the component body is fired, a difference in the contraction behavior occurs between the portion where the coil conductor is formed and the portion where the coil conductor is not formed. Thus, cracking may occur in the component body and the coil conductor may be broken.

Furthermore, according to the technique described in Patent Document 1, in the step of stacking the plurality of ceramic green sheets and press-bonding the plurality of ceramic green sheets, the possibility of displacement, deformation, and breaking of the coil conductors is concerned.

In order to solve the above-mentioned problems, for example, Japanese Unexamined Patent Application Publication No. 10-12455 (Patent Document 2) suggests that a coil conductor is formed by arranging a punched groove in a ceramic green sheet and filling the punched groove with conductive paste.

SUMMARY

The present disclosure provides a monolithic ceramic electronic component that is capable of solving problems occurring in the related arts mentioned above and satisfying the demands described above.

In one aspect of the present disclosure, a monolithic ceramic electronic component includes a component body including a plurality of stacked ceramic layers and internal conductors arranged in association with specific layers of the ceramic layers, the internal conductors including coil conductors extending in a coil shape so as to be connected sequentially over the plurality of ceramic layers. In order to solve the technical problems described above, the coil conductors have more than one turn for the individual ceramic layers.

In a more specific embodiment of the monolithic ceramic electronic component, the coil conductors, which have more than one turn for the individual ceramic layers, include surface coil conductors that are located along surfaces of the ceramic layers, intra-layer coil conductors that are located inside the ceramic layers so as not to extend beyond the thickness of the individual ceramic layers, and connecting portions that allow series connection between the surface coil conductors and the intra-layer coil conductors.

In another more specific embodiment, the intra-layer coil conductors are arranged so as to extend through the individual ceramic layers in a direction of the thickness of the ceramic layers, and the surface coil conductors and the intra-layer coil conductors are located at positions different in a main-surface direction of the ceramic layers such that the surface coil conductors and the intra-layer coil conductors are electrically insulated from each other except for the connecting portions.

In yet another more specific embodiment, the intra-layer coil conductors are arranged so as not to extend through the individual ceramic layers in a direction of the thickness of the ceramic layers, and in order such that the surface coil conductors and the intra-layer coil conductors are electrically insulated from each other except for the connecting portions, insulators arranged over the intra-layer coil conductors are further provided, the insulators are arranged between the surface coil conductors and the intra-layer coil conductors, and a surface coil conductor formed on one of neighboring two ceramic layers and an intra-layer coil conductor formed in the other one of the neighboring two ceramic layers are located at positions different in a main-surface direction of the ceramic layers.

In another more specific embodiment, a ceramic layer in which, as a coil conductor, only a surface coil conductor that is located along a surface of a ceramic layer is provided, may be provided.

In another more specific embodiment, a ceramic layer in which, as a coil conductor, only an intra-layer coil conductor that is located inside a ceramic layer so as not to extend beyond the thickness of the ceramic layer is provided, may be provided.

The monolithic ceramic electronic component according to the present disclosure may be in a form of a component mount board further including an external conductive film that is formed on an outer surface of the component body; and a surface mount electronic component that is mounted on the outer surface of the component body so as to be connected to the external conductive film or may be in a form of a chip coil further including connection conductors that are led to outer surfaces of the component body so as to be connected to the internal conductors; and external terminal electrodes that are formed on the outer surfaces of the component body so as to be connected to the connection conductors.

In another aspect of the present disclosure, a method for producing a monolithic ceramic electronic component includes a step of preparing a plurality of ceramic green sheets on which coil conductors extending in a coil shape are formed; a step of producing an unfired component body by stacking the plurality of ceramic green sheets in such a manner that the plurality of coil conductors formed on the individual ceramic green sheets are sequentially connected and press-bonding the plurality of stacked ceramic green sheets; and a step of firing the unfired component body. In order to solve the technical problems described above, the method for producing the monolithic ceramic electronic component according to the present invention has the configuration described below.

That is, the step of preparing the ceramic green sheets includes a step of preparing a first ceramic green sheet on which a surface coil conductor that is located along a surface of the ceramic green sheet, an intra-layer coil conductor that is located inside the ceramic green sheet so as not to extend beyond the thickness of the ceramic green sheet, and a connecting portion that allows series connection between the surface coil conductor and the intra-layer coil conductor are provided.

In a more specific embodiment of the method for producing a monolithic ceramic electronic component, the step of preparing the first ceramic green sheet includes a step of forming the intra-layer coil conductor so as to extend through the ceramic green sheet in a direction of the thickness of the ceramic green sheet and a step of forming the surface coil conductor at a position that is different from the position of the intra-layer coil conductor in a main-surface direction of the ceramic green sheet.

In another more specific embodiment of the method for producing the monolithic ceramic electronic component, the step of preparing the first ceramic green sheet includes a step of forming the intra-layer coil conductor so as not to extend through the ceramic green sheet in a direction of the thickness of the ceramic green sheet, a step of forming an insulator over the intra-layer coil conductor, and a step of forming the surface coil conductor over the insulator.

In the method for producing the monolithic ceramic electronic component, the step of preparing the ceramic green sheets may include a step of preparing a second ceramic green sheet on which, as one of the coil conductors, only a surface coil conductor that is located along a surface of the ceramic green sheet is provided. In this case, the step of producing the unfired component body includes a step of providing an interlayer connection conductor so as to extend through a specific ceramic green sheet of the ceramic green sheets in a direction of the thickness of the specific ceramic green sheet and a step of stacking the plurality of ceramic green sheets in such a manner that part of the surface coil conductor on the first ceramic green sheet is connected to part of the surface coil conductor on the second ceramic green sheet with the interlayer connection conductor therebetween and press-bonding the plurality of ceramic green sheets.

In the method for producing the monolithic ceramic electronic component, the step of preparing the ceramic green sheets may include a step of preparing a third ceramic green sheet in which, as one of the coil conductors, only an intra-layer coil conductor that is located inside the ceramic green sheet so as not to extend beyond the thickness of the ceramic green sheet is provided. In this case, the step of producing the unfired component body includes a step of stacking the plurality of ceramic green sheets in such a manner that part of the intra-layer coil conductor in the first ceramic green sheet and part of the intra-layer coil conductor in the third ceramic green sheet are connected and press-bonding the plurality of ceramic green sheets.

DETAILED DESCRIPTION

Figure 1:
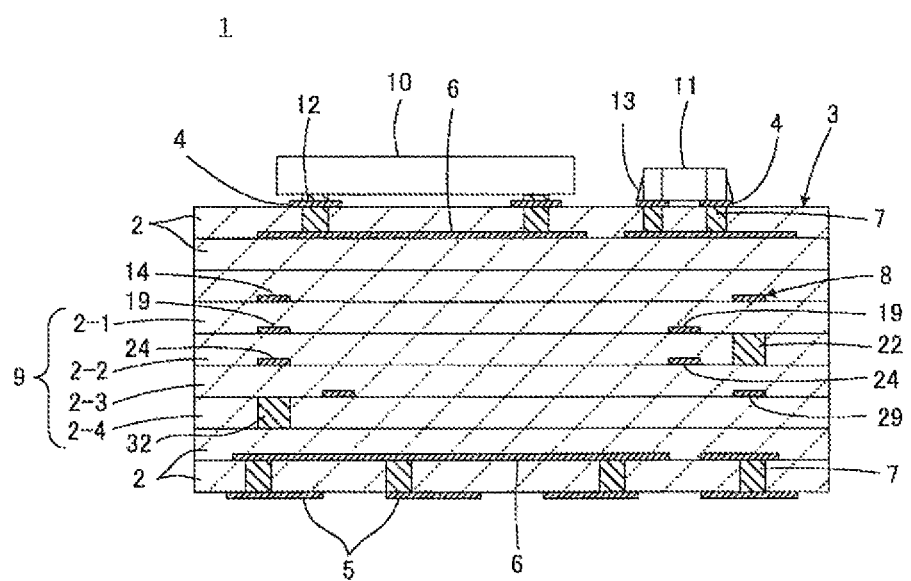
FIG. 1 is a cross-sectional view illustrating a monolithic ceramic electronic component according to a first embodiment of the present invention.

The inventor realized that further improvements can be made over the techniques described in Patent Documents 1 and 2 to address demand for compatibility between an enhancement in functions and a reduction in the size of electronic components. For example, being capable of reducing the number of stacked ceramic layers while maintaining the performance of coils can contribute to the compatibility between the enhancement in functions and the reduction in the size of an electronic component.

A monolithic ceramic electronic component 1 according to a first exemplary embodiment will now be explained with reference to FIG. 1.

The monolithic ceramic electronic component 1 includes a component body 3 having a laminated structure including a plurality of stacked ceramic layers 2. External conductive films 4 and 5 are arranged on an upper main surface and a lower main surface of the component body 3, respectively. Some internal conductors are arranged inside the component body 3, in association with specific ceramic layers 2.

The internal conductors have various forms. First, in-plane conductive films 6 extending along between the ceramic layers 2 are provided. Second, interlayer connection conductors 7 extending through the ceramic layers 2 in the direction of the thickness of the ceramic layers 2 are provided. Furthermore, when classification is made in view of an electrical function, coil conductors 8 functioning as coils are provided. The coil conductors 8 extend in a coil shape so as to be connected sequentially over a plurality of ceramic layers 2-1, 2-2, 2-3, and 2-4 located in a coil portion 9 in the component body 3.

The reference sign "2" assigned to the "ceramic layers" is used for all the ceramic layers including the "ceramic layers 2-1, 2-2, 2-3, and 2-4." When it is necessary to distinguish the ceramic layers 2 in the coil portion 9 from the other ceramic layers, reference signs "2-1," "2-2," "2-3," and "2-4" are used for the ceramic layers 2 in the coil portion 9.

A detailed explanation of the coil conductors 8 will be provided later. The coil conductors 8 are characterized by having more than one turn for one ceramic layer. Although not illustrated, internal conductors different from the coil conductors 8 may be provided in the ceramic layers 2-1 to 2-4 in the coil portion 9.

The ceramic layers 2 are formed of, for example, ferrite ceramic materials. For example, ferrite ceramic materials can have an Fe—Ni—Zn—Cu-based composition, an Fe—Zn—Cu-based composition, or an Fe—Mn—Zn-based composition. All the ceramic layers 2 may be formed of ferrite ceramic materials. Alternatively, only the ceramic layers 2-1 to 2-4 in the coil portion 9 may be formed of ferrite ceramic materials and the other ceramic layers 2 may be formed of dielectric ceramic materials or insulating ceramic materials.

The monolithic ceramic electronic component 1 forms, for example, a DC-DC converter. Surface mount electronic components 10 and 11 are mounted on the upper main surface of the component body 3. The electronic component 10 is, for example, an IC chip, and is electrically connected to the external conductive films 4 with solder bumps 12 therebetween. The electronic component 11 is, for example, a chip capacitor, and is electrically connected to the external conductive films 4 with solders 13 therebetween. The external conductive films 5 formed on the lower main surface of the component body 3 are used as terminal electrodes when the monolithic ceramic electronic component 1 is mounted on a mother board, which is not illustrated.

Next, the structure of the coil portion 9 will be explained with reference to FIG. 2 as well as FIG. 1. Among the ceramic layers 2-1 to 2-4 forming the coil portion 9, the first layer, which is the uppermost layer, that is, the ceramic layer 2-1, the second layer, which is the second uppermost layer, that is, the ceramic layer 2-2, the third layer, which is the third uppermost layer, that is, the ceramic layer 2-3, and the fourth layer, which is the fourth uppermost layer, that is, the ceramic layer 2-4, are illustrated as plan views in parts (1), (2), (3), and (4) of FIG. 2, respectively. The cross-sectional view of FIG. 1 illustrates the cross section taken along line A-A of parts (1) to (4) of FIG. 2.

In principle, the coil conductors 8 include surface coil conductors located along surfaces of the ceramic layers 2-1 to 2-4 and intra-layer coil conductors located inside the ceramic layers 2-1 to 2-4 so as not to extend beyond the thickness of the individual ceramic layers. The coil conductors 8 also include connecting portions that allow series connection between the surface coil conductors and the intra-layer coil conductors. In FIG. 2, the surface coil conductors are illustrated by relatively dense hatching, and the intra-layer coil conductors are illustrated by relatively rough hatching in an opposite direction. Such hatching forms are adopted in other corresponding figures.

Figure 2:
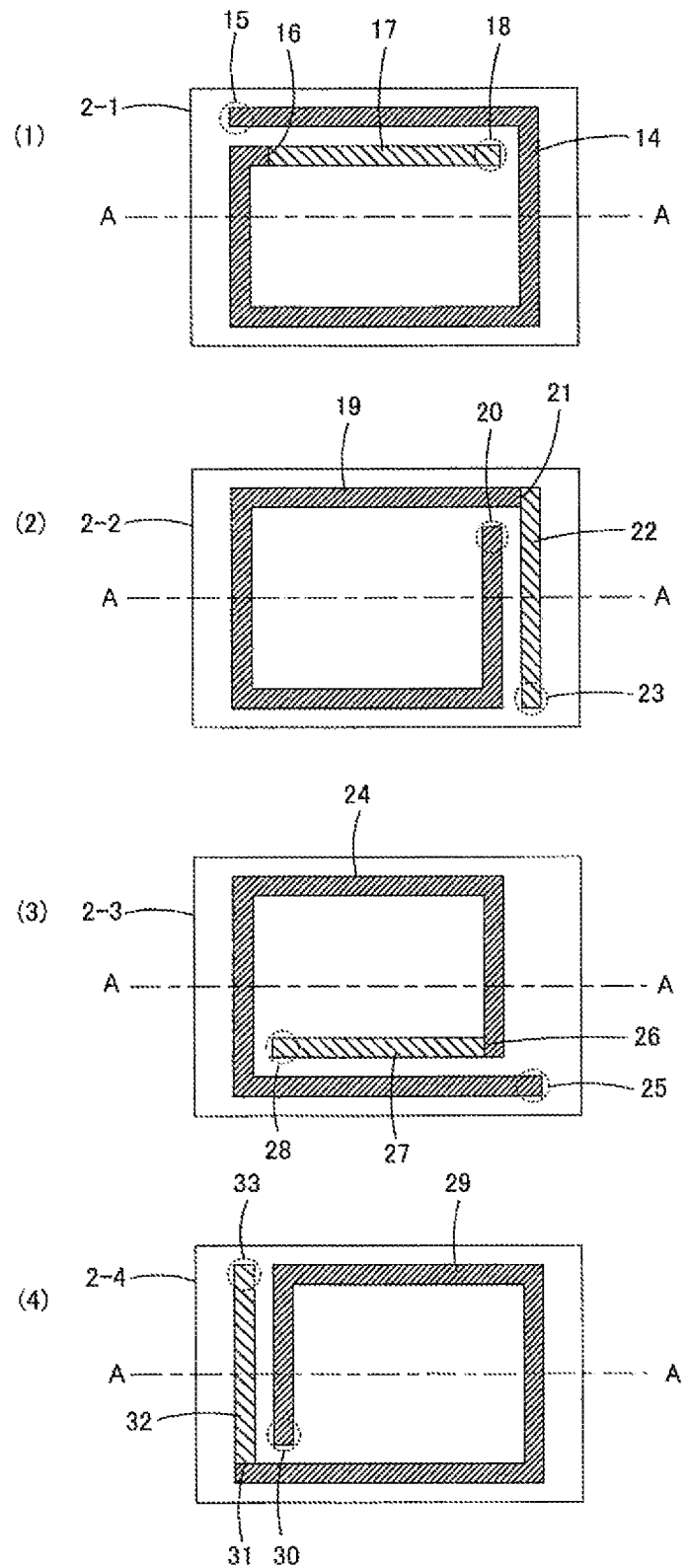
FIG. 2 includes plan views illustrating ceramic layers forming a coil portion of the monolithic ceramic electronic component illustrated in FIG. 1.

Referring to part (1) of FIG. 2, in an upper surface of the first ceramic layer 2-1, a surface coil conductor 14 is clockwisely formed for approximately one turn starting from a start edge 15 on the upper left of the drawing, and an intra-layer coil conductor 17 is connected in series to the surface coil conductor 14 in a connecting portion 16. Another circuit element, which is not illustrated, is electrically connected to the start edge 15 of the surface coil conductor 14. The intra-layer coil conductor 17 is formed for approximately ¼ turn so as to be located inside the ceramic layer 2-1 and to extend through the ceramic layer 2-1 in the direction of the thickness of the ceramic layer 2-1.

In order such that the surface coil conductor 14 and the intra-layer coil conductor 17 are electrically insulated from each other except for the connecting portion 16, the surface coil conductor 14 and the intra-layer coil conductor 17 are formed at positions different in a main-surface direction of the ceramic layers 2.

As described above, in the first ceramic layer 2-1, the surface coil conductor 14 and the intra-layer coil conductor 17 are formed, in total for approximately 5/4 turns, in such a manner that the surface coil conductor 14 and the intra-layer coil conductor 17 are not formed on the same plane but are formed so as to be shifted in the direction that is orthogonal to the main-surface direction of the ceramic layer 2-1. Since the intra-layer coil conductor 17 extends through the ceramic layer 2-1 in the direction of the thickness of the ceramic layer 2-1, the intra-layer coil conductor 17 is also exposed to a lower-surface side of the ceramic layer 2-1. Thus, only an end edge 18 of the intra-layer coil conductor 17 provides a connecting portion for the second ceramic layer 2-2.

Next, referring to part (2) of FIG. 2, in an upper surface of the second ceramic layer 2-2, a surface coil conductor 19 is clockwisely formed for approximately one turn starting from a start edge 20, which is connected to the end edge 18 of the intra-layer coil conductor 17, and an intra-layer coil conductor 22 is connected in series to the surface coil conductor 19 in a connecting portion 21. The intra-layer coil conductor 22 is formed for approximately ¼ turn so as to be located inside the ceramic layer 2-2 and to extend through the ceramic layer 2-2 in the direction of the thickness of the ceramic layer 2-2. To electrically insulate the surface coil conductor 19 from the intra-layer coil conductor 22 except for the connecting portion 21, the surface coil conductor 19 and the intra-layer coil conductor 22 are formed at positions different in the main-surface direction of the ceramic layers 2. Furthermore, except for the start edge 20, the location of the surface coil conductor 19 is shifted from, or positioned in an area separate from the location of the intra-layer coil conductor 17 in the first layer in the main-surface direction of the ceramic layers 2.

As described above, also in the second ceramic layer 2-2, the surface coil conductor 19 and the intra-layer coil conductor 22 are formed, in total for approximately 5/4 turns, in such a manner that the surface coil conductor 19 and the intra-layer coil conductor 22 are not formed on the same plane but are formed so as to be shifted in the direction that is orthogonal to the main-surface direction of the ceramic layer 2-2. Since the intra-layer coil conductor 22 extends through the ceramic layer 2-2 in the direction of the thickness of the ceramic layer 2-2, the intra-layer coil conductor 22 is also exposed to a lower surface side of the ceramic layer 2-2. Thus, only an end edge 23 of the intra-layer coil conductor 22 provides a connecting portion for the third ceramic layer 2-3.

Next, referring to part (3) of FIG. 2, in an upper surface of the third ceramic layer 2-3, a surface coil conductor 24 is clockwise formed for approximately one turn starting from a start edge 25, which is connected to the end edge 23 of the intra-layer coil conductor 22, and an intra-layer coil conductor 27 is connected in series to the surface coil conductor 24 in a connecting portion 26. The intra-layer coil conductor 27 is formed for approximately ¼ turn so as to be located inside the ceramic layer 2-3 and to extend through the ceramic layer 2-3 in the direction of the thickness of the ceramic layer 2-3. In order such that the surface coil conductor 24 and the intra-layer coil conductor 27 are electrically insulated from each other except for the connecting portion 26, the surface coil conductor 24 and the intra-layer coil conductor 27 are formed at positions different in the main-surface direction of the ceramic layers 2. Furthermore, except for the start edge 25, the location of the surface coil conductor 24 is shifted from, or positioned in an area separate from the location of the intra-layer coil conductor 22 in the second layer in the main-surface direction of the ceramic layers 2.

As described above, also in the third ceramic layer 2-3, the surface coil conductor 24 and the intra-layer coil conductor 27 are formed, in total for approximately 5/4 turns, in such a manner that the surface coil conductor 24 and the intra-layer coil conductor 27 are not formed on the same plane but are formed so as to be shifted in the direction that is orthogonal to the main-surface direction of the ceramic layer 2-3. Since the intra-layer coil conductor 27 extends through the ceramic layer 2-3 in the direction of the thickness of the ceramic layer 2-3, the intra-layer coil conductor 27 is also exposed to a lower surface side of the ceramic layer 2-3. Thus, only an end edge 28 of the intra-layer coil conductor 27 provides a connecting portion for the fourth ceramic layer 2-4.

Next, referring to part (4) of FIG. 2, in an upper surface of the fourth ceramic layer 2-4, a surface coil conductor 29 is clockwise formed for approximately one turn starting from a start edge 30, which is connected to the end edge 28 of the intra-layer coil conductor 27, and an intra-layer coil conductor 32 is connected in series to the surface coil conductor 29 in a connecting portion 31. The intra-layer coil conductor 32 is formed for approximately ¼ turn so as to be located inside the ceramic layer 2-4 and to extend through the ceramic layer 2-4 in the direction of the thickness of the ceramic layer 2-4. In order such that the surface coil conductor 29 and the intra-layer coil conductor 32 are electrically insulated from each other except for the connecting portion 31, the surface coil conductor 29 and the intra-layer coil conductor 32 are formed at positions different in the main-surface direction of the ceramic layers 2. Furthermore, except for the start edge 30, the location of the surface coil conductor 29 is shifted from, or positioned in an area separate from the location of the intra-layer coil conductor 27 in the third layer in the main-surface direction of the ceramic layers 2.

As described above, also in the fourth ceramic layer 2-4, the surface coil conductor 29 and the intra-layer coil conductor 32 are formed, in total for approximately 5/4 turns, in such a manner that the surface coil conductor 29 and the intra-layer coil conductor 32 are not formed on the same plane but are formed so as to be shifted in the direction that is orthogonal to the main-surface direction of the ceramic layer 2-3. Since the intra-layer coil conductor 32 extends through the ceramic layer 2-4 in the direction of the thickness of the ceramic layer 2-4, the intra-layer coil conductor 32 is also exposed to a lower surface side of the ceramic layer 2-4. Thus, an end edge 33 of the intra-layer coil conductor 32 provides a connecting portion for another circuit element (not illustrated).

The above-described structure is also applied to FIG. 1, which illustrates the cross section taken along line A-A in parts (1) to (4) of FIG. 2.

An exemplary method for producing the monolithic ceramic electronic component 1 will now be explained.

First, ceramic green sheets to be formed into the ceramic layers 2 are prepared. The ceramic green sheets are obtained by adding a binder, a plasticizer, a wetting agent, a dispersant, etc. to ceramic raw material powder to form slurry and forming the slurry into sheets.

Then, through holes are formed in specific ceramic green sheets. The through holes are filled with conductive paste to form the interlayer connection conductors 7 (i.e., via hole conductors) in a non-sintered state. In addition, the conductive paste is printed on specific ceramic green sheets to form the external conductive films 4 and 5 in a non-sintered state and the in-plane conductive films 6 in a non-sintered state.

In order to form the intra-layer coil conductors 17, 22, 27, and 32, slits extending through the ceramic sheets to be formed into the ceramic layers 2-1 to 2-4 are arranged, and the slits are filled with conductive paste. Then, in order to form the surface coil conductors 14, 19, 24, and 29, conductive paste is printed. In this processing, the conductive paste for the intra-layer coil conductors 17, 22, 27, and 32 and the conductive paste for the surface coil conductors 14, 19, 24, and 29 may be applied at the same time.

For example, conductive paste obtained by dispersing metal powder, such as Ag powder, Ag—Pd powder, Ag—Pt powder, Cu powder, Au powder, Pt powder, or Al powder, as a main component of a conductive material, in an organic vehicle to form paste is used as conductive paste for forming the external conductive films 4 and 5, the in-plane conductive films 6, the interlayer connection conductors 7, the surface coil conductors 14, 19, 24, and 29, and the intra-layer coil conductors 17, 22, 27, and 32. Adjustment may be made such that, in order to improve the performance of printing, the amount of metal powder contained in conductive paste to be formed into the external conductive films 4 and 5, the in-plane conductive films 6, and the surface coil conductors 14, 19, 24, and 29 is smaller than the amount of metal powder contained in conductive paste to be formed into the interlayer connection conductors 7 and the intra-layer coil conductors 17, 22, 27, and 32.

Then, by stacking the ceramic green sheets in a specific order and then press-bonding the stacked ceramic green sheets, the component body 3 in a non-sintered state is obtained. In the non-sintered component body 3, the surface coil conductors 14, 19, 24, and 29 and the intra-layer coil conductors 17, 22, 27, and 32 are sequentially connected so that the coil conductors 8 are formed, as described above.

In the case where the above-described processing is performed for component bodies 3 in an aggregated state for producing a plurality of monolithic ceramic electronic components 1 at the same time, in order to easily divide the component bodies 3 in the aggregated state later, dividing grooves are formed.

Then, the component body 3 in the non-sintered state is fired. Accordingly, the sintered component body 3 is obtained.

Next, plating processing is performed for the external conductive films 4 and 5 that are exposed to the surfaces of the component body 3. More specifically, electroplating is performed, and thus, for example, a nickel plating film and a tin plating film are sequentially formed. Plating may be electroless plating. In this case, for example, a nickel plating film and a gold plating film are sequentially formed.

Next, the surface mount electronic components 10 and 11 are mounted on the upper main surface of the component body 3 so as to be electrically connected to the external conductive films 4.

In the case where the above-processing is performed for the component bodies 3 in the aggregated state, processing for dividing the component bodies 3 along the above-mentioned dividing grooves is performed. Accordingly, individual monolithic ceramic electronic components 1 are taken out. Although not illustrated, a metal cover can be provided for the monolithic ceramic electronic component 1 according to need.

In the explanation provided above, the dividing grooves are formed before the firing processing. However, without forming dividing grooves, the component bodies 3 in the aggregated state may be divided before the firing processing, and the individual component bodies 3 in a raw sate for corresponding monolithic ceramic electronic components 1 may be taken out. In this case, the firing processing is performed for the individual component bodies 3, and for example, barrel electroplating is applied for plating processing.

Figure 3:
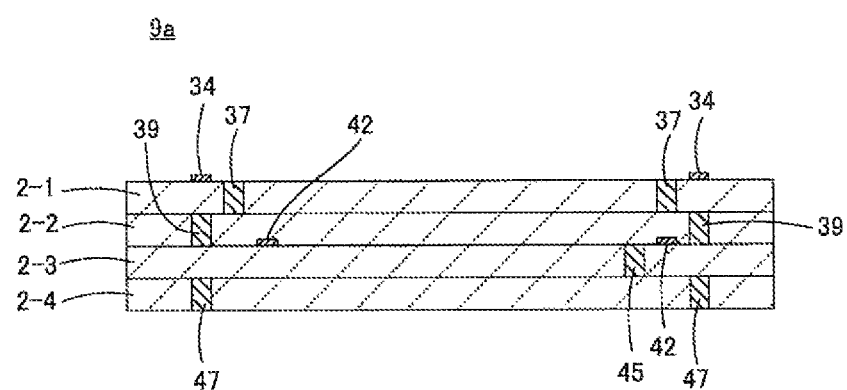
FIG. 3 is a cross-sectional view illustrating an extracted coil portion of a monolithic ceramic electronic component according to a second embodiment of the present invention.
Figure 4:
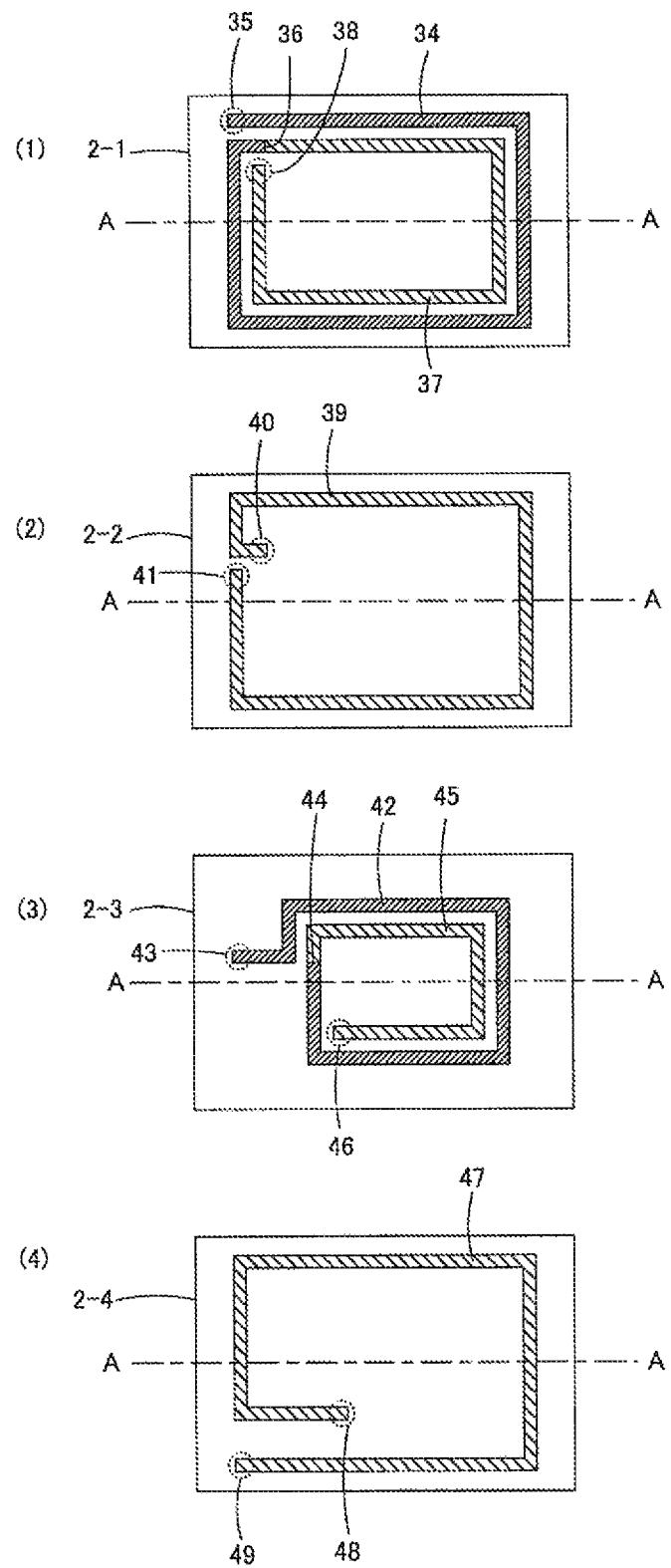
FIG. 4 includes plan views illustrating ceramic layers forming the coil portion illustrated in FIG. 3.

A second exemplary embodiment will now be explained with reference to FIGS. 3 and 4. For the ceramic layers 2-1 to 2-4 in FIGS. 3 and 4, reference signs similar to those used in FIGS. 1 and 2 are used. FIG. 3 is a cross-sectional view illustrating only an extracted coil portion 9a corresponding to the coil portion 9 of the monolithic ceramic electronic component 1 illustrated in FIG. 1. The cross-sectional view of FIG. 3 illustrates the cross section taken along line A-A of parts (1) to (4) of FIG. 4. FIG. 4 corresponds to FIG. 2 and includes plan views illustrating the ceramic layers 2-1, 2-2, 2-3, and 2-4 forming the coil portion 9a illustrated in FIG. 3. In FIGS. 3 and 4, the width of coil conductors and the distance between coil conductors are illustrated as being narrower than other embodiments. However, this difference is not essential to the second embodiment.

Referring to part (1) of FIG. 4, in the upper surface of the first ceramic layer 2-1, a surface coil conductor 34 is clockwisely formed for approximately one turn starting from a start edge 35 on the upper left of the drawing, and an intra-layer coil conductor 37 is connected in series to the surface coil conductor 34 in a connecting portion 36. Another circuit element, which is not illustrated, is electrically connected to the start edge 35 of the surface coil conductor 34. The intra-layer coil conductor 37 is formed for approximately one turn so as to be located inside the ceramic layer 2-1 and to extend through the ceramic layer 2-1 in the direction of the thickness of the ceramic layer 2-1. In order such that the surface coil conductor 34 and the intra-layer coil conductor 37 are electrically insulated from each other except for the connecting portion 36, the surface coil conductor 34 and the intra-layer coil conductor 37 are formed at positions different in the main-surface direction of the ceramic layers 2.

As described above, in the first ceramic layer 2-1, the surface coil conductor 34 and the intra-layer coil conductor 37 are formed, in total for approximately two turns, in such a manner that the surface coil conductor 34 and the intra-layer coil conductor 37 are not formed on the same plane but are formed so as to be shifted in the direction that is orthogonal to the main-surface direction of the ceramic layer 2-1. Since the intra-layer coil conductor 37 extends through the ceramic layer 2-1 in the direction of the thickness of the ceramic layer 2-1, the intra-layer coil conductor 37 is also exposed to the lower surface side of the ceramic layer 2-1. Thus, only an end edge 38 of the intra-layer coil conductor 37 provides a connecting portion for the second ceramic layer 2-2.

Next, referring to part (2) of FIG. 4, in the second ceramic layer 2-2, an intra-layer coil conductor 39 is clockwisely formed for approximately one turn starting from a start edge 40, which is connected to the end edge 38 of the intra-layer coil conductor 37. The intra-layer coil conductor 39 is located inside the ceramic layer 2-2 and extends through the ceramic layer 2-2 in the direction of the thickness of the ceramic layer 2-2. In order such that the intra-layer coil conductor 37 and the intra-layer coil conductor 39 are electrically insulated from each other except for the connecting portion for the end edge 38 of the intra-layer coil conductor 37 and the start edge 40 of the intra-layer coil conductor 39, the intra-layer coil conductor 37 and the intra-layer coil conductor 39 are formed at positions different in the main-surface direction of the ceramic layers 2 (i.e., at non-overlapping positions except in the local area of the start edge 40).

Since the intra-layer coil conductor 39 extends through the ceramic layer 2-2 in the direction of the thickness of the ceramic layer 2-2, the intra-layer coil conductor 39 is also exposed to the lower surface side of the ceramic layer 2-2. Thus, only an end edge 41 of the intra-layer coil conductor 39 provides a connecting portion for the third ceramic layer 2-3.

Next, referring to part (3) of FIG. 4, in the upper surface of the third ceramic layer 2-3, a surface coil conductor 42 is clockwisely formed for approximately one turn starting from a start edge 43, which is connected to the end edge 41 of the intra-layer coil conductor 39, and an intra-layer coil conductor 45 is connected in series to the surface coil conductor 42 in a connecting portion 44. The intra-layer coil conductor 45 is formed for approximately one turn so as to be located inside the ceramic layer 2-3 and to extend through the ceramic layer 2-3 in the direction of the thickness of the ceramic layer 2-3. In order such that the surface coil conductor 42 and the intra-layer coil conductor 45 are electrically insulated from each other except for the connecting portion 44, the surface coil conductor 42 and the intra-layer coil conductor 45 are formed at positions different (i.e., separate areas) in the main-surface direction of the ceramic layers 2. Furthermore, except for the start edge 43 of the surface coil conductor 42, the locations of the surface coil conductor 42 and the intra-layer coil conductor 45 are shifted from, or positioned in areas separate from the location of the intra-layer coil conductor 39 in the second layer in the main-surface direction of the ceramic layers 2 (i.e., at non-overlapping positions except in the local area of the start edge 43).

As described above, in the third ceramic layer 2-3, the surface coil conductor 42 and the intra-layer coil conductor 45 are formed, in total for approximately two turns, in such a manner that the surface coil conductor 42 and the intra-layer coil conductor 45 are not formed on the same plane but are formed so as to be shifted in the direction that is orthogonal to the main-surface direction of the ceramic layer 2-3. Since the intra-layer coil conductor 45 extends through the ceramic layer 2-3 in the direction of the thickness of the ceramic layer 2-3, the intra-layer coil conductor 45 is also exposed to the lower surface side of the ceramic layer 2-3. Thus, only an end edge 46 of the intra-layer coil conductor 45 provides a connecting portion for the fourth ceramic layer 2-4.

Next, referring to part (4) of FIG. 4, in the upper surface of the fourth ceramic layer 2-4, an intra-layer coil conductor 47 is clockwisely formed for approximately 9/8 turns starting from a start edge 48, which is connected to the end edge 46 of the intra-layer coil conductor 45. The intra-layer coil conductor 47 is located inside the ceramic layer 2-4 and extends through the ceramic layer 2-4 in the direction of the thickness of the ceramic layer 2-4. In order such that the intra-layer coil conductor 45 and the intra-layer coil conductor 47 are electrically insulated from each other except for the connecting portion for the end edge 46 of the intra-layer coil conductor 45 and the start edge 48 of the intra-layer coil conductor 47, the intra-layer coil conductor 45 and the intra-layer coil conductor 47 are formed at positions different in the main-surface direction of the ceramic layers 2 (i.e., at non-overlapping positions except in the local area of the start edge 48). An end edge 49 of the intra-layer coil conductor 47 provides a connecting portion for another circuit element (not illustrated).

The above-described structure is also applied to FIG. 3, which illustrates the cross-section taken along line A-A of parts (1) to (4) of FIG. 4.

Figure 5:
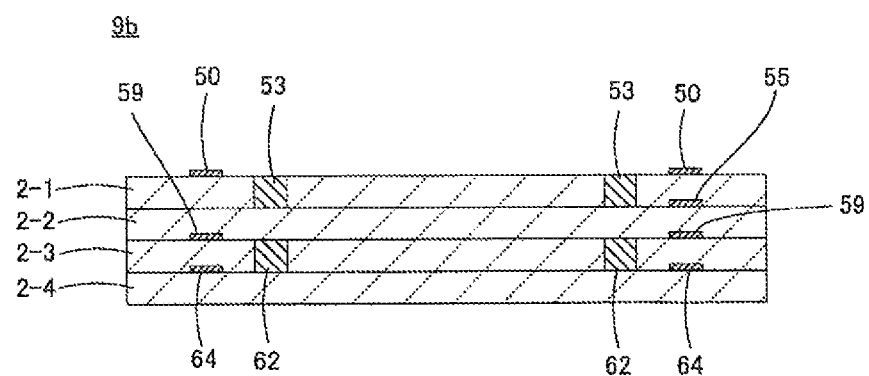
FIG. 5 is a cross-sectional view illustrating an extracted coil portion of a monolithic ceramic electronic component according to a third embodiment of the present invention.
Figure 6:
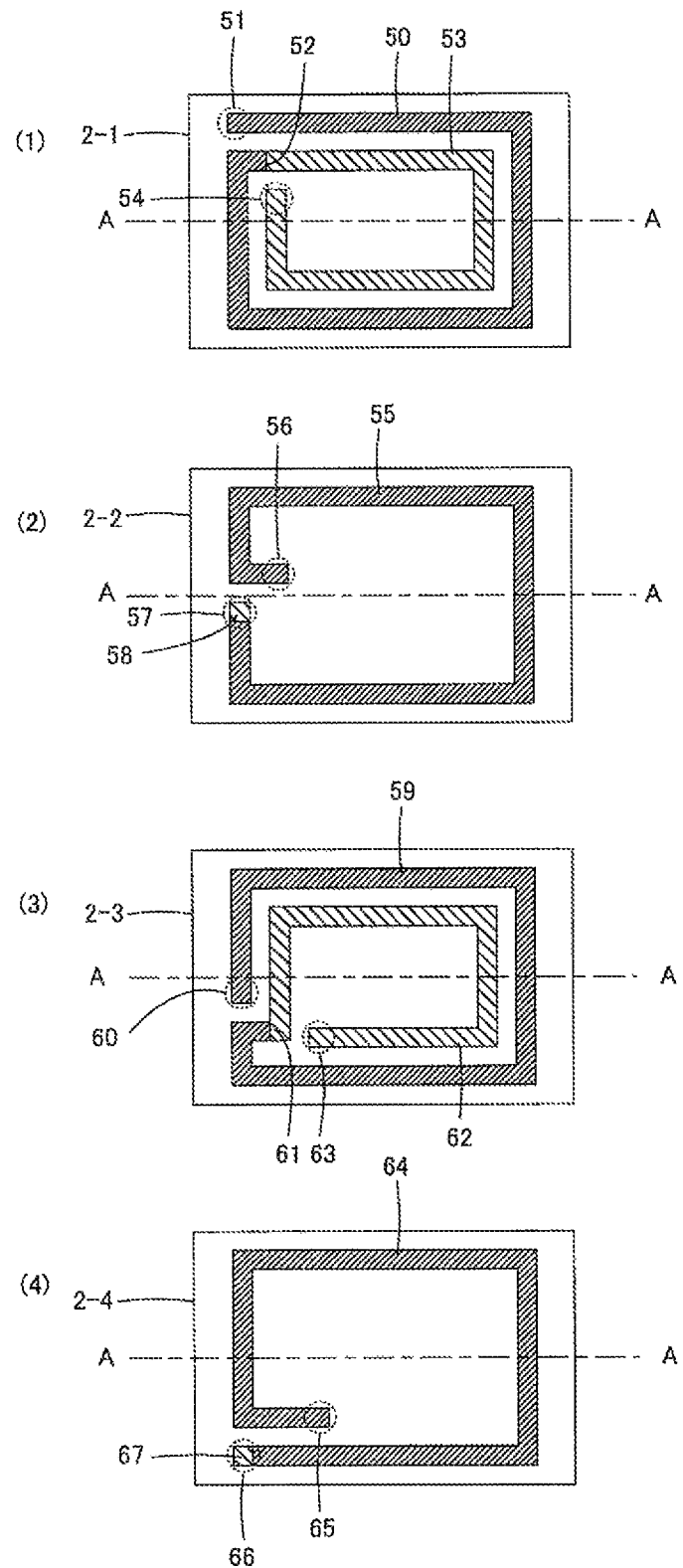
FIG. 6 includes plan views illustrating ceramic layers forming the coil portion illustrated in FIG. 5.

A third exemplary embodiment will be explained with reference to FIGS. 5 and 6. For the ceramic layers 2-1 to 2-4 in FIGS. 5 and 6, reference signs similar to those used in FIGS. 1 and 2 are used. FIG. 5 is a cross-sectional view illustrating only an extracted coil portion 9b corresponding to the coil portion 9 of the monolithic ceramic electronic component 1 illustrated in FIG. 1. The cross-sectional view of FIG. 5 illustrates the cross section taken along line A-A of parts (1) to (4) of FIG. 6. FIG. 6 corresponds to FIG. 2 and includes plan views illustrating the ceramic layers 2-1, 2-2, 2-3, and 2-4 forming the coil portion 9b illustrated in FIG. 5.

Referring to part (1) of FIG. 6, in the upper surface of the first ceramic layer 2-1, a surface coil conductor 50 is clockwisely formed for approximately one turn starting from a start edge 51 on the upper left of the drawing, and an intra-layer coil conductor 53 is connected in series to the surface coil conductor 50 in a connecting portion 52. Another circuit element, which is not illustrated, is electrically connected to the start edge 51 of the surface coil conductor 50. The intra-layer coil conductor 53 is formed for approximately one turn so as to be located inside the ceramic layer 2-1 and to extend through the ceramic layer 2-1 in the direction of the thickness of the ceramic layer 2-1. In order such that the surface coil conductor 50 and the intra-layer coil conductor 53 are electrically insulated from each other except for the connecting portion 52, the surface coil conductor 50 and the intra-layer coil conductor 53 are formed at positions different in the main-surface direction of the ceramic layers 2.

As described above, in the first ceramic layer 2-1, the surface coil conductor 50 and the intra-layer coil conductor 53 are formed, in total for approximately two turns, in such a manner that the surface coil conductor 50 and the intra-layer coil conductor 53 are not formed on the same plane but are formed so as to be shifted in the direction that is orthogonal to the main-surface direction of the ceramic layer 2-1. Since the intra-layer coil conductor 53 extends through the ceramic layer 2-1 in the direction of the thickness of the ceramic layer 2-1, the intra-layer coil conductor 53 is also exposed to the lower surface side of the ceramic layer 2-1. Thus, only an end edge 54 of the intra-layer coil conductor 53 provides a connecting portion for the second ceramic layer 2-2.

Next, referring to part (2) of FIG. 6, on the upper surface of the second ceramic layer 2-2, a surface coil conductor 55 is clockwisely formed for approximately one turn starting from a start edge 56, which is connected to the end edge 54 of the intra-layer coil conductor 53. In order such that the surface coil conductor 55 is electrically isolated from the intra-layer coil conductor 53 except for the connecting portion for the start edge 56 of the surface coil conductor 55 and the end edge 54 of the intra-layer coil conductor 53, the surface coil conductor 55 is formed at a position different from the intra-layer coil conductor 53 in the main-surface direction of the ceramic layers 2 (i.e., at non-overlapping positions except in the local area of the start edge 54).

An interlayer connection conductor 58 that extends through the ceramic layer 2-2 in the direction of the thickness of the ceramic layer 2-2 is provided at an end edge 57 of the surface coil conductor 55. The interlayer connection conductor 58 is also exposed to the lower surface side of the ceramic layer 2-2. Thus, only the interlayer connection conductor 58 provides a connecting portion for the third ceramic layer 2-3.

Next, referring to part (3) of FIG. 6, in the upper surface of the third ceramic layer 2-3, a surface coil conductor 59 is clockwisely formed for approximately one turn starting from a start edge 60, which is connected to the interlayer connection conductor 58, and an intra-layer coil conductor 62 is connected in series to the surface coil conductor 59 in a connecting portion 61. The intra-layer coil conductor 62 is formed for approximately one turn so as to be located inside the ceramic layer 2-3 and to extend through the ceramic layer 2-3 in the direction of the thickness of the ceramic layer 2-3. To electrically insulate the surface coil conductor 59 from the intra-layer coil conductor 62 except for the connecting portion 61, the surface coil conductor 59 and the intra-layer coil conductor 62 are formed at positions different in the main-surface direction of the ceramic layers 2.

As described above, in the third ceramic layer 2-3, the surface coil conductor 59 and the intra-layer coil conductor 62 are formed, in total for approximately two turns, in such a manner that the surface coil conductor 59 and the intra-layer coil conductor 62 are not formed on the same plane but are formed so as to be shifted in the direction that is orthogonal to the main-surface direction of the ceramic layer 2-3. Since the intra-layer coil conductor 62 extends through the ceramic layer 2-3 in the direction of the thickness of the ceramic layer 2-3, the intra-layer coil conductor 62 is also exposed to the lower surface side of the ceramic layer 2-3. Thus, only an end edge 63 of the intra-layer coil conductor 62 provides a connecting portion for the fourth ceramic layer 2-4.

Next, referring to part (4) of FIG. 6, on the upper surface of the fourth ceramic layer 2-4, a surface coil conductor 64 is clockwisely formed for approximately one turn starting from a start edge 65, which is connected to the end edge 63 of the intra-layer coil conductor 62. Except for the start edge 65, the location of the surface coil conductor 64 is shifted from, or positioned in an area separate from the location of the intra-layer coil conductor 62 in the third layer in the main-surface direction of the ceramic layers 2 (i.e., at non-overlapping positions except in the local area of the start edge 64). An interlayer connection conductor 67 is provided at an end edge 66 of the surface coil conductor 64 so as to extend through the ceramic layer 2-4 in the direction of the thickness of the ceramic layer 2-4. The interlayer connecting portion 67 provides a connecting portion for another circuit element (not illustrated).

The above-described structure is also applied to FIG. 5, which illustrates the cross section taken along line A-A of parts (1) to (4) of FIG. 6.

Figure 7:
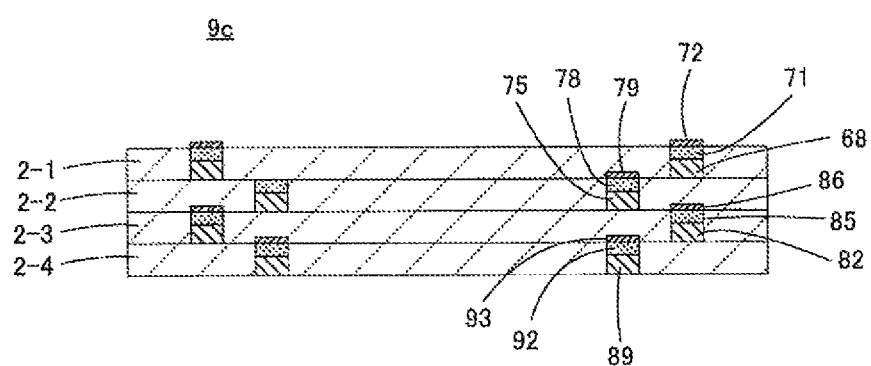
FIG. 7 is a cross-sectional view illustrating an extracted coil portion of a monolithic ceramic electronic component according to a fourth embodiment of the present invention.

A fourth exemplary embodiment will now be explained with reference to FIGS. 7 to 11. For the ceramic layers 2-1 to 2-4 in FIGS. 7 and 11, reference signs similar to those used in FIGS. 1 and 2 are used. FIG. 7 is a cross-sectional view illustrating only an extracted coil portion 9c corresponding to the coil portion 9 of the monolithic ceramic electronic component 1 illustrated in FIG. 1. The cross-sectional view of FIG. 7 illustrates the cross section taken along line A-A of FIGS. 8 to 11.

First, the first ceramic layer 2-1 forming the coil portion 9c illustrated in FIG. 7 will be explained with reference to FIG. 8.

Figure 8:
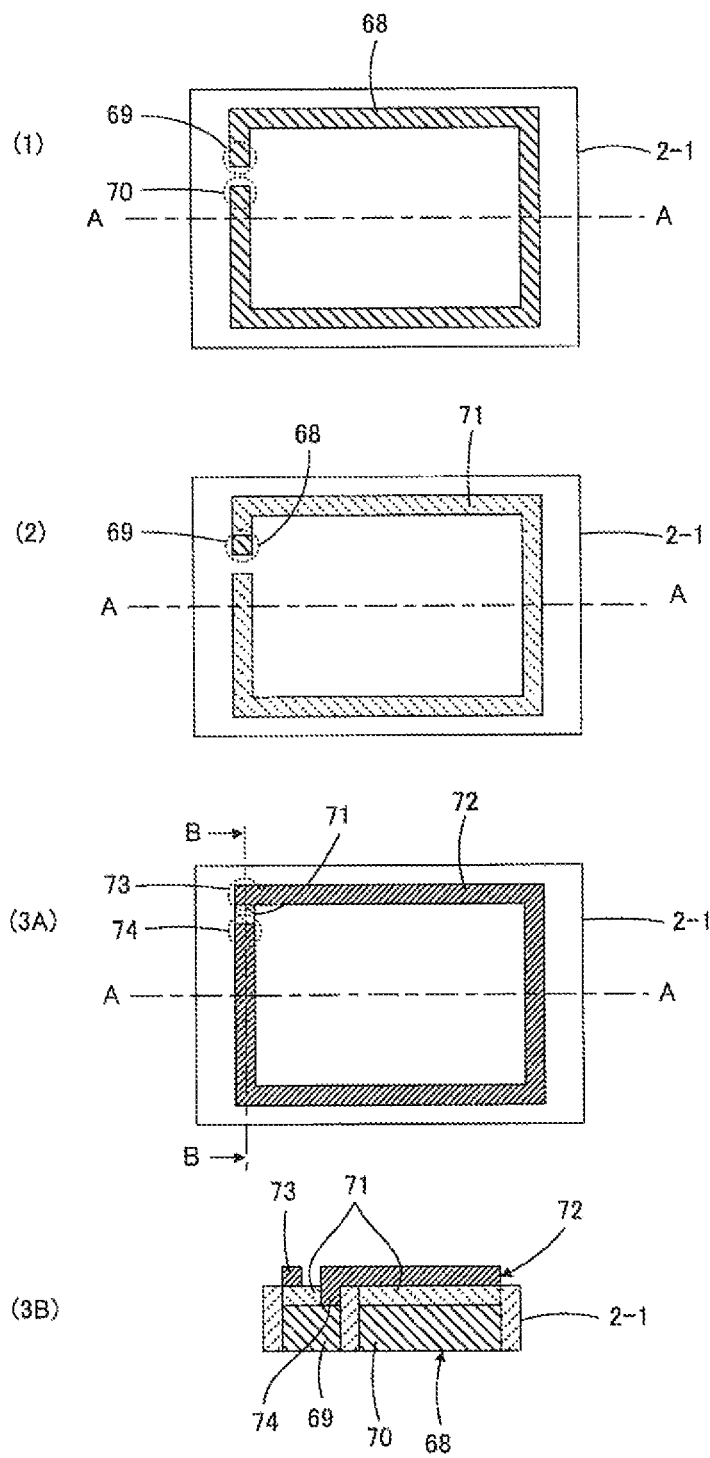
FIG. 8 illustrates the first ceramic layer forming the coil portion illustrated in FIG. 7, parts (1), (2), and (3A) are plan views sequentially illustrating a process for producing the first ceramic layer, and part (3B) is a cross-sectional view taken along line B-B of part (3A).

As illustrated in part (1) of FIG. 8, in the first ceramic layer 2-1, an intra-layer coil conductor 68 is clockwisely formed for approximately one turn starting from a start edge 69 of the intra-layer coil conductor 68 to an end edge 70 of the intra-layer coil conductor 68. As illustrated in part (3B) of FIG. 8, the intra-layer coil conductor 68 is exposed to the lower surface of the ceramic layer 2-1, but does not extend completely through the ceramic layer 2-1 in the direction of the thickness of the ceramic layer 2-1. Part (3B) of FIG. 8 illustrates the cross section taken along line B-B of part (3A) of FIG. 8. In part (3B) of FIG. 8, the size in the thickness direction is exaggerated. The same applies to other corresponding drawings.

Then, as illustrated in part (2) of FIG. 8, an insulator 71 is arranged so as to cover the intra-layer coil conductor 68 except for the start edge 69 of the intra-layer coil conductor 68. Specifically, the insulator 71 is formed by filling a slit, into which conductive paste for the intra-layer coil conductor 68 is introduced, with ceramic slurry.

Then, as illustrated in parts (3A) and (3B) of FIG. 8, a surface coil conductor 72 is arranged over the insulator 71. The surface coil conductor 72 is clockwisely formed for approximately one turn starting from a start edge 73 of the surface coil conductor 72 to an end edge 74 of the surface coil conductor 72. The end edge 74 of the surface coil conductor 72 is connected to the start edge 69 of the intra-layer coil conductor 68.

As described above, in the first ceramic layer 2-1, a coil conductor that clockwisely extends from the start edge 73 of the surface coil conductor 72 to the end edge 70 of the intra-layer coil conductor 68 in such a manner that the surface coil conductor 72 and the intra-layer coil conductor 68 are not formed on the same plane but are formed so as to be shifted in the direction that is orthogonal to the main-surface direction of the ceramic layer 2-1, is formed.

Since the intra-layer coil conductor 68 is exposed to the lower surface side of the ceramic layer 2-1, only the end edge 70 of the intra-layer coil conductor 68 provides a connecting portion for the second ceramic layer 2-2.

Next, the second ceramic layer 2-2 forming the coil portion 9c illustrated in FIG. 7 will be explained with reference to FIG. 9.

Figure 9:
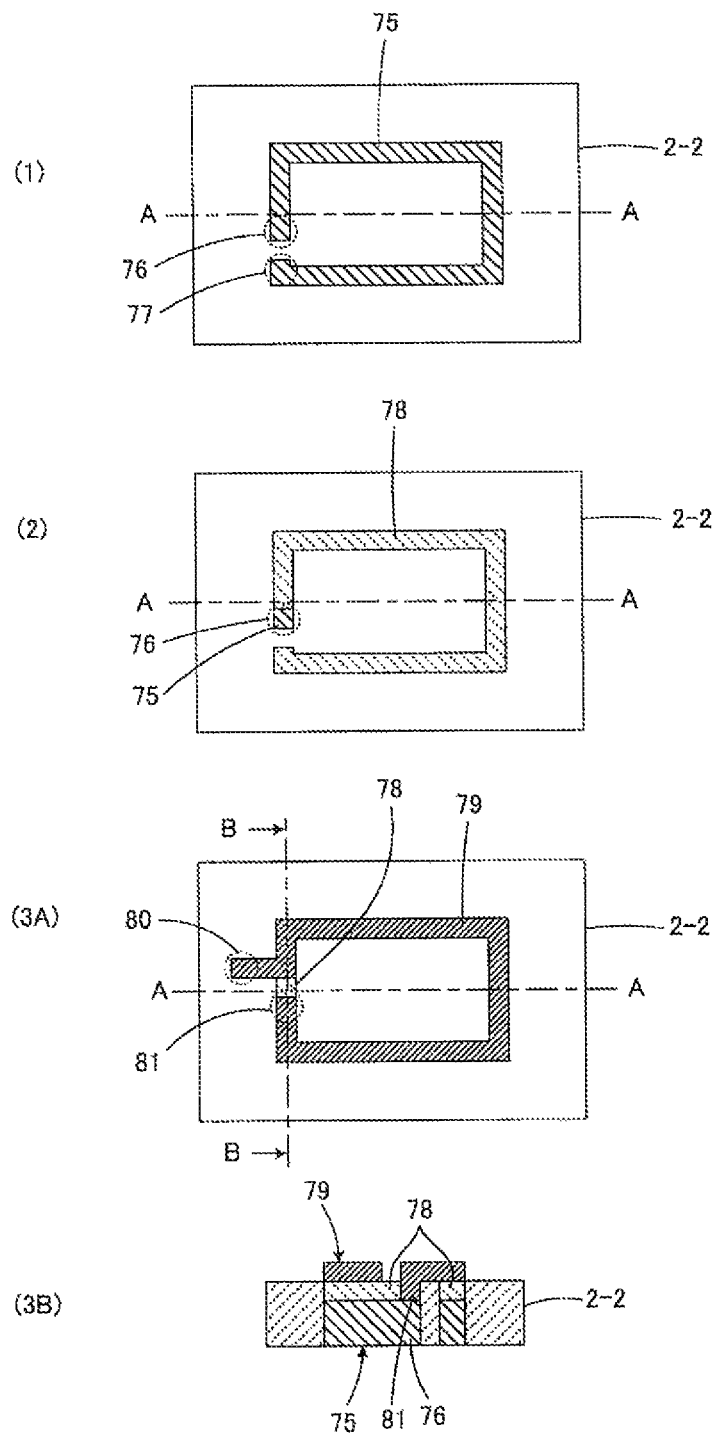
FIG. 9 illustrates the second ceramic layer forming the coil portion illustrated in FIG. 7, parts (1), (2), and (3A) are plan views sequentially illustrating a process for producing the second ceramic layer, and part (3B) is a cross-sectional view taken along line B-B of part (3A).

As illustrated in part (1) of FIG. 9, in the second ceramic layer 2-2, an intra-layer coil conductor 75 is clockwisely formed for approximately one turn starting from a start edge 76 of the intra-layer coil conductor 75 to an end edge 77 of the intra-layer coil conductor 75. As illustrated in part (3B) of FIG. 9, the intra-layer coil conductor 75 is exposed to the lower surface of the ceramic layer 2-2 and does not extend completely through the ceramic layer 2-2 in the direction of the thickness of the ceramic layer 2-2.

Then, as illustrated in part (2) of FIG. 9, an insulator 78 is arranged so as to cover the intra-layer coil conductor 75 except for the start edge 76 of the intra-layer coil conductor 75. Specifically, the insulator 78 is formed by filling a slit, into which conductive paste for the intra-layer coil conductor 75 is introduced, with ceramic slurry.

Then, as illustrated in parts (3A) and (3B) of FIG. 9, a surface coil conductor 79 is arranged over the insulator 78. The surface coil conductor 79 is clockwisely formed for approximately one turn starting from a start edge 80 of the surface coil conductor 79 to an end edge 81 of the surface coil conductor 79. The end edge 81 of the surface coil conductor 79 is connected to the start edge 76 of the intra-layer coil conductor 75.

As described above, in the second ceramic layer 2-2, a coil conductor that clockwisely extends from the start edge 80 of the surface coil conductor 79 to the end edge 77 of the intra-layer coil conductor 75 in such a manner that the surface coil conductor 79 and the intra-layer coil conductor 75 are not formed on the same plane but are formed so as to be shifted in the direction that is orthogonal to the main-surface direction of the ceramic layer 2-2, is formed.

The end edge 70 of the intra-layer coil conductor 68 in the first ceramic layer 2-1 is connected to the start edge 80 of the surface coil conductor 79. In order such that the intra-layer coil conductor 68 and the surface coil conductor 79 are electrically insulated from each other except for the connecting portion for the end edge 70 of the intra-layer coil conductor 68 and the start edge 80 of the surface coil conductor 79, the intra-layer coil conductor 68 and the surface coil conductor 79 are formed at positions different in the main-surface direction of the ceramic layers 2 (i.e., at non-overlapping positions except in the local area of the start edge 80).

Since the intra-layer coil conductor 75 is exposed to the lower surface side of the ceramic layer 2-2, only the end edge 77 of the intra-layer coil conductor 75 provides a connecting portion for the third ceramic layer 2-3.

Next, the third ceramic layer 2-3 forming the coil portion 9c illustrated in FIG. 7 will be explained with reference to FIG. 10.

Figure 10:
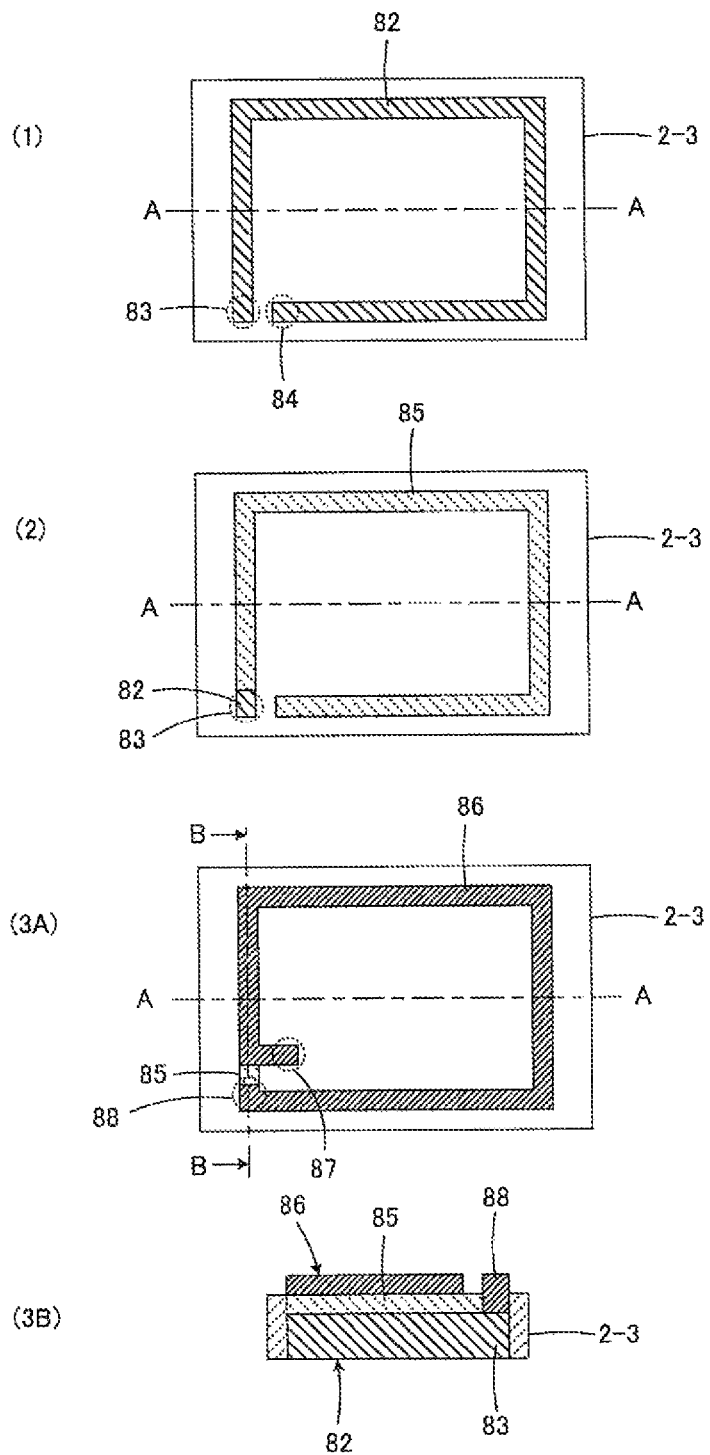
FIG. 10 illustrates the third ceramic layer forming the coil portion illustrated in FIG. 7, parts (1), (2), and (3A) are plan views sequentially illustrating a process for producing the third ceramic layer, and part (3B) is a cross-sectional view taken along line B-B of part (3A).

As illustrated in part (1) of FIG. 10, in the third ceramic layer 2-3, an intra-layer coil conductor 82 is clockwisely formed for approximately one turn starting from a start edge of the intra-layer coil conductor 82 to an end edge 84 of the intra-layer coil conductor 82. As illustrated in part (3B) of FIG. 10, the intra-layer coil conductor 82 is exposed to the lower surface of the ceramic layer 2-3 and does not extend completely through the ceramic layer 2-3 in the direction of the thickness of the ceramic layer 2-3.

Then, as illustrated in part (2) of FIG. 10, an insulator 85 is arranged so as to cover the intra-layer coil conductor 82 except for the start edge 83 of the intra-layer coil conductor 82. Specifically, the insulator 85 is formed by filling a slit, into which conductive paste for the intra-layer coil conductor 82 is introduced, with ceramic slurry.

Then, as illustrated in parts (3A) and (3B) of FIG. 10, a surface coil conductor 86 is arranged over the insulator 85. The surface coil conductor 86 is clockwisely formed for approximately one turn starting from a start edge 87 of the surface coil conductor 86 to an end edge 88 of the surface coil conductor 86. The end edge 88 of the surface coil conductor 86 is connected to the start edge 83 of the intra-layer coil conductor 82.

As described above, in the third ceramic layer 2-3, a coil conductor that clockwisely extends from the start edge 87 of the surface coil conductor 86 to the end edge 84 of the intra-layer coil conductor 82 in such a manner that the surface coil conductor 86 and the intra-layer coil conductor 82 are not formed on the same plane but are formed so as to be shifted in the direction that is orthogonal to the main-surface direction of the ceramic layer 2-3, is formed.

The end edge 77 of the intra-layer coil conductor 75 in the second ceramic layer 2-2 is connected to the start edge 87 of the surface coil conductor 86. In order such that the intra-layer coil conductor 75 and the surface coil conductor 86 are electrically insulated from each other except for the connecting portion for the end edge 77 of the intra-layer coil conductor 75 and the start edge 87 of the surface coil conductor 86, the intra-layer coil conductor 75 and the surface coil conductor 86 are formed at positions different in the main-surface direction of the ceramic layers 2 (i.e., at non-overlapping positions except in the local area of the start edge 87).

Since the intra-layer coil conductor 82 is exposed to the lower surface side of the ceramic layer 2-3, only the end edge 84 of the intra-layer coil conductor 82 provides a connecting portion for the fourth ceramic layer 2-4.

Next, the fourth ceramic layer 2-4 forming the coil portion 9c illustrated in FIG. 7 will be explained with reference to FIG. 11.

Figure 11:
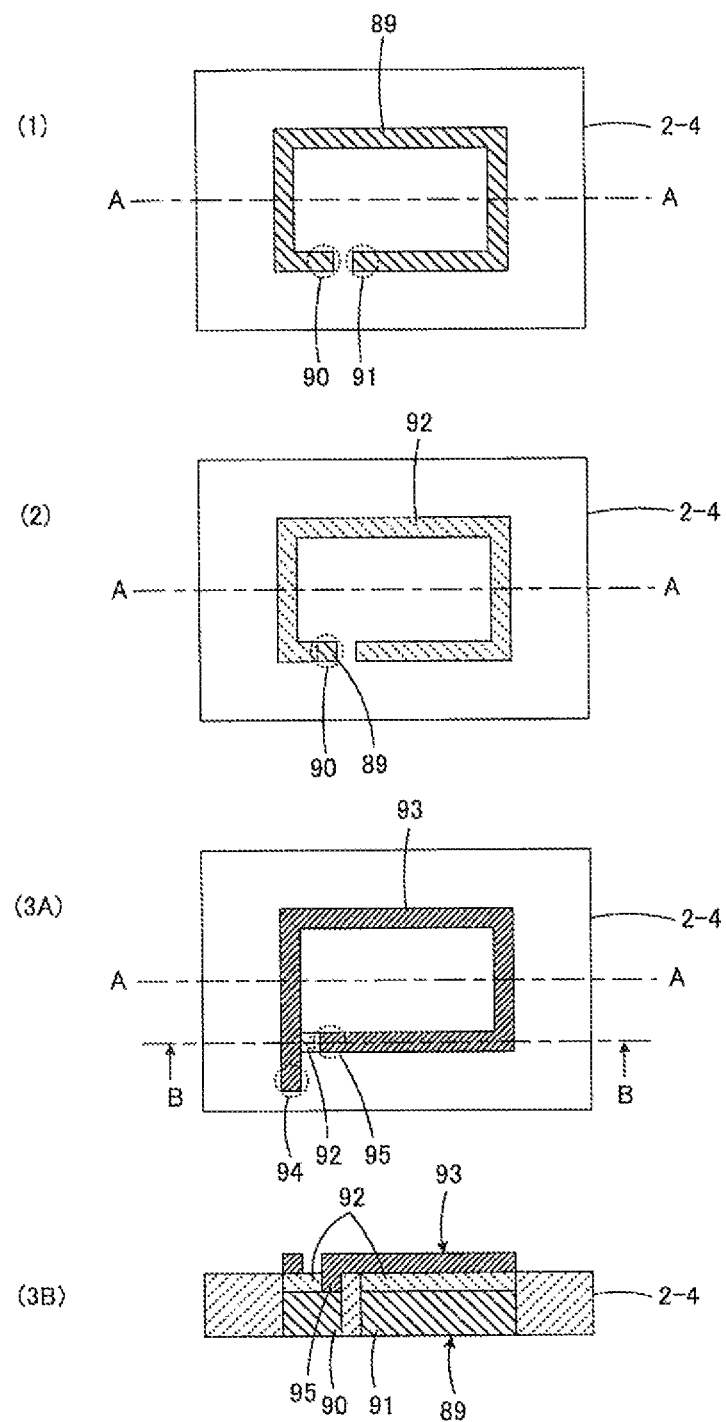
FIG. 11 illustrates the fourth ceramic layer forming the coil portion illustrated in FIG. 7, parts (1), (2), and (3A) are plan views sequentially illustrating a process for producing the fourth ceramic layer, and part (3B) is a cross-sectional view taken along line B-B of part (3A).

As illustrated in part (1) of FIG. 11, in the fourth ceramic layer 2-4, an intra-layer coil conductor 89 is clockwisely formed for approximately one turn starting from a start edge 90 of the intra-layer coil conductor 89 to an end edge 91 of the intra-layer coil conductor 89. As illustrated in part (3B) of FIG. 11, the intra-layer coil conductor 89 is exposed to the lower surface of the ceramic layer 2-4 and does not extend completely through the ceramic layer 2-4 in the direction of the thickness of the ceramic layer 2-4.

Then, as illustrated in part (2) of FIG. 11, an insulator 92 is arranged so as to cover the intra-layer coil conductor 89 except for the start edge 90 of the intra-layer coil conductor 89. Specifically, the insulator 90 is formed by filling a slit, into which conductive paste for the intra-layer coil conductor 89 is introduced, with ceramic slurry.

Then, as illustrated in parts (3A) and (3B) of FIG. 11, a surface coil conductor 93 is arranged over the insulator 92. The surface coil conductor 93 is clockwisely formed for approximately one turn starting from a start edge 94 of the surface coil conductor 93 to an end edge 95 of the surface coil conductor 93. The end edge 95 of the surface coil conductor 93 is connected to the start edge 90 of the intra-layer coil conductor 89.

As described above, in the fourth ceramic layer 2-4, a coil conductor that clockwisely extends from the start edge 94 of the surface coil conductor 93 to the end edge 91 of the intra-layer coil conductor 89 in such a manner that the surface coil conductor 93 and the intra-layer coil conductor 89 are not formed on the same plane but are formed so as to be shifted in the direction that is orthogonal to the main-surface direction of the ceramic layer 2-4, is formed.

The end edge 84 of the intra-layer coil conductor 82 in the third ceramic layer 2-3 is connected to the start edge 94 of the surface coil conductor 93. In order such that the intra-layer coil conductor 82 and the surface coil conductor 93 are electrically insulated from each other except for the connecting portion for the end edge 84 of the intra-layer coil conductor 82 and the start edge 94 of the surface coil conductor 93, the intra-layer coil conductor 82 and the surface coil conductor 93 are formed at positions different in the main-surface direction of the ceramic layers 2 (i.e., at non-overlapping positions except in the local area of the start edge 94).

Since the intra-layer coil conductor 89 is exposed to the lower surface side of the ceramic layer 2-4, the end edge 91 of the intra-layer coil conductor 89 provides a connecting portion for another circuit element (not illustrated).

The above-described structure is also applied to FIG. 7, which illustrates the cross-section taken along line A-A of FIGS. 8 to 11.

In FIGS. 7 to 11, the intra-layer coil conductors are formed so as not to extend completely through ceramic layers in the direction of the thickness of the ceramic layers. However, the intra-layer coil conductors may be formed so as to extend through the ceramic layers in the direction of the thickness of the ceramic layers, ceramic slurry may be applied over the intra-layer coil conductors to form insulators, and surface coil conductors may be formed over the insulators.

Figure 12:
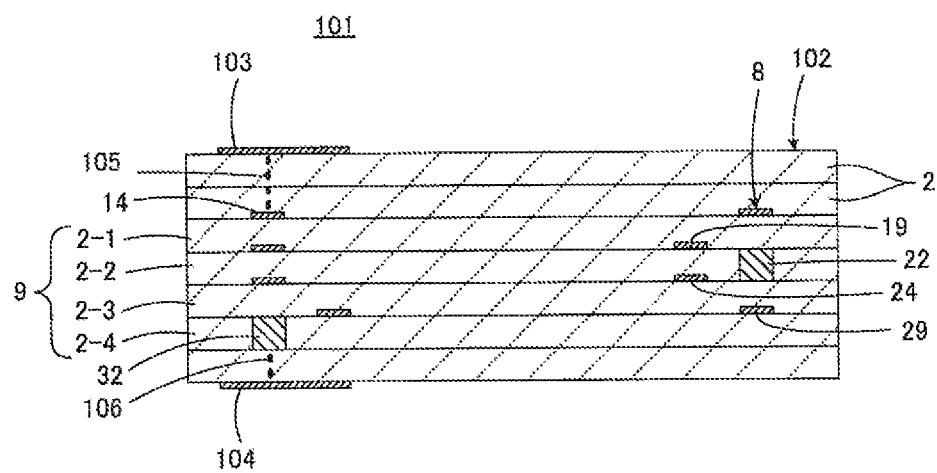
FIG. 12 is a cross-sectional view illustrating a monolithic ceramic electronic component according to a fifth embodiment of the present invention.

FIG. 12 is a cross-sectional view illustrating a monolithic chip coil 101 as a monolithic ceramic electronic component according to a fifth exemplary embodiment. The monolithic chip coil 101 illustrated in FIG. 12 includes elements that are common with those of the monolithic ceramic electronic component 1, which has been explained with reference to FIGS. 1 and 2. Thus, those common elements are referred to with similar reference signs and redundant explanations are not provided.

The monolithic chip coil 101 includes terminal electrodes 103 and 104 that are formed on an upper main surface and a lower main surface of a component body 102, respectively. The terminal electrode 103 is connected to a start edge 15 of a surface coil conductor 14 of coil conductors 8 (see part (1) of FIG. 2) with a connection conductor 105 therebetween. The terminal electrode 104 is connected to an end edge 33 of an intra-layer coil conductor 32 of the coil conductors 8 with a connection conductor 106 therebetween (see part (4) of FIG. 2).

Since the connection conductors 105 and 106 do not appear on the cross section illustrated in FIG. 12, the connection conductors 105 and 106 are expressed using broken lines. Although not illustrated, an alteration may be made in such a manner that the terminal electrodes 103 and 104 are formed on side surfaces of the component body 102 and the connection conductors 105 and 106 are led to the side surfaces of the component body 102.

In the first to fifth exemplary embodiments described above, the number of ceramic layers 2 forming the coil portion 9 is four. However, the number of layers may be increased or decreased according to need.

In order to confirm effects of a monolithic chip coil according to the present disclosure, inductance was estimated for Examples 1 to 4 in which the coil structures in the first to fourth embodiments described above are applied to the monolithic chip coil illustrated in FIG. 12.

Figure 13:
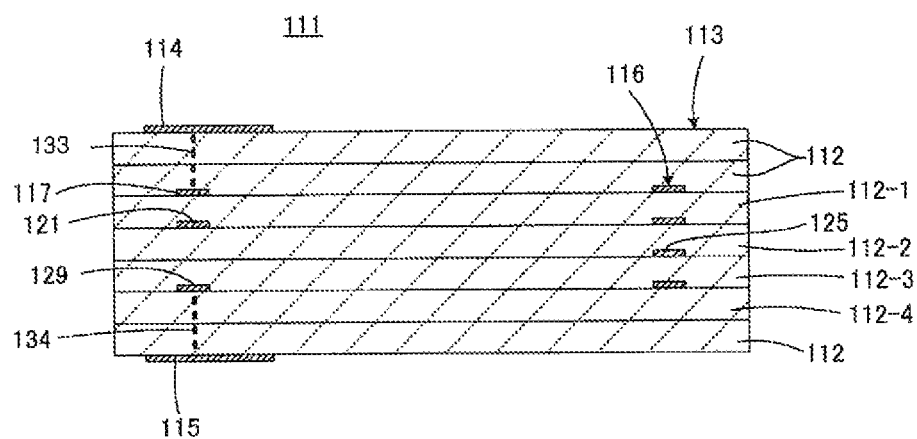
FIG. 13 is a cross-sectional view illustrating a monolithic ceramic electronic component according to a comparative example of the present invention.
Figure 14:
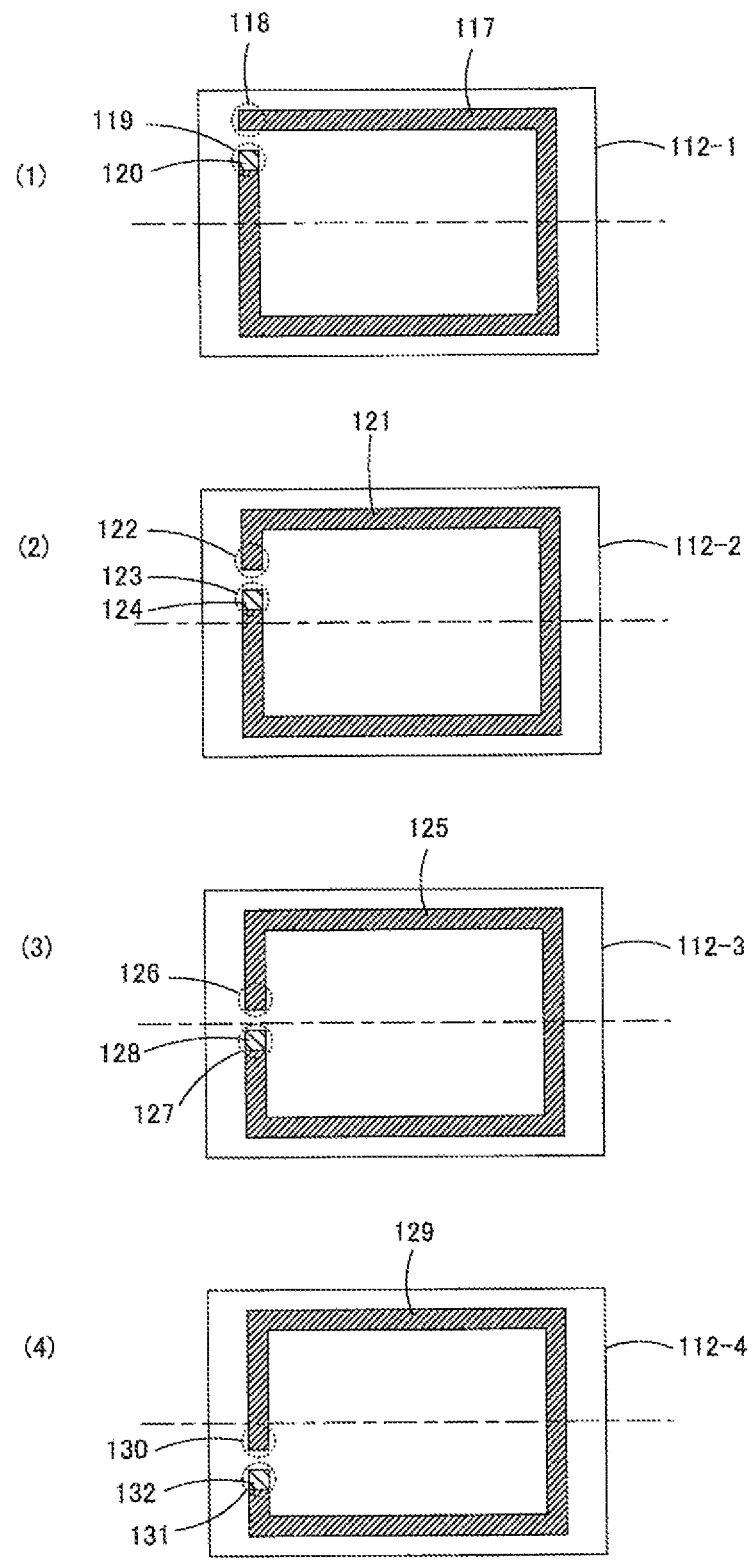
FIG. 14 includes plan views illustrating ceramic layers forming a coil portion of the monolithic ceramic electronic component illustrated in FIG. 13.

Here, in order to easily compare effects of a monolithic chip coil according to the present disclosure with related arts, a monolithic chip coil 111 illustrated in FIGS. 13 and 14 was produced as a comparative example.

The monolithic chip coil 111 according to the comparative example will be explained. The monolithic chip coil 111 includes a component body 113 having a laminated structure including a plurality of stacked ceramic layers 112. Terminal electrodes 114 and 115 are arranged on an upper main surface and a lower main surface of the component body 113, respectively. Coil conductors 116 are formed inside the component body 113. The coil conductors 116 extend in a coil shape so as to be connected sequentially over four ceramic layers 112-1, 112-2, 112-3, and 112-4 of the component body 113.

More specifically, as illustrated in part (1) of FIG. 14, in an upper surface of the first ceramic layer 112-1, a surface coil conductor 117 is clockwisely formed for approximately one turn starting from a start edge 118 to an end edge 119, and an interlayer connection conductor 120 that extends through the ceramic layer 112-1 in the direction of the thickness of the ceramic layer 112-1 is provided at the end edge 119.

Then, as illustrated in part (2) of FIG. 14, on an upper surface of the second ceramic layer 112-2, a surface coil conductor 121 is clockwisely formed for approximately one turn starting from a start edge 122 to an end edge 123. The interlayer connection conductor 120 described above is connected to the start edge 122 of the surface coil conductor 121. An interlayer connection conductor 124 that extends through the ceramic layer 112-2 in the direction of the thickness of the ceramic layer 112-2 is provided at the end edge 123 of the surface coil conductor 121.

Then, as illustrated in part (3) of FIG. 14, on an upper surface of the third ceramic layer 112-3, a surface coil conductor 125 is clockwisely formed for approximately one turn starting from a start edge 126 to an end edge 127. The interlayer connection conductor 124 described above is connected to the start edge 126 of the surface coil conductor 125. An interlayer connection conductor 128 that extends through the ceramic layer 112-3 in the direction of the thickness of the ceramic layer 112-3 is provided at the end edge 127 of the surface coil conductor 125.

Then, as illustrated in part (4) of FIG. 14, on an upper surface of the fourth ceramic layer 112-4, a surface coil conductor 129 is clockwisely formed for approximately one turn starting from a start edge 130 to an end edge 131. The interlayer connection conductor 128 described above is connected to the start edge 130 of the surface coil conductor 129. An interlayer connection conductor 132 that extends through the ceramic layer 112-4 in the direction of the thickness of the ceramic layer 112-4 is provided at the end edge 131 of the surface coil conductor 129.

Referring back to FIG. 13, the terminal electrode 114 is connected to the start edge 118 of the surface coil conductor 117 in the coil conductors 116 with a connection conductor 133 therebetween (see part (1) of FIG. 14). The terminal electrode 115 is connected to the intra-layer coil conductor 132 at the end edge 131 of the communication line 129 in the coil conductors 116 with a connection conductor 134 therebetween (see part (4) of FIG. 14).

For Examples 1 to 4 and the comparative example described above, the number of ceramic layers was set to four, the thickness of each of the ceramic layers was set to 25 μm, and the width of the coil conductors was set to 200 μm. Under the same conditions described above, inductance at 1 MHz was measured. Table 1 represents the results of the measurement. Table 1 also represents the number of turns of coils.

TABLE 1

|  | Number of Turns of Coils | Inductance (μH) |
| --- | --- | --- |
| Example 1 | 5 | 0.61 |
| Example 2 | 6 | 0.82 |
| Example 3 | 6 | 0.81 |
| Example 4 | 8 | 1.21 |
| Comparative Example | 4 | 0.45 |

As is clear from Table 1, in Examples 1 to 4, the number of turns of coils is greater than the number of ceramic layers. As a result, compared to the comparative example, a higher inductance can be achieved.

In embodiments consistent with the present disclosure, since coil conductors having more than one turn for one ceramic layer is provided, the number of stacked ceramic layers can be reduced without sacrifice of the performance of coils and the number of turns of the coils can be increased without increasing the size of a monolithic ceramic electronic component. Thus, the compatibility between a reduction in the size, in particular, a reduction in the height, and an enhancement in the performance of a monolithic ceramic electronic component can be achieved.

By forming coil conductors with the combination of a surface coil conductor that is located along a surface of a ceramic layer and an intra-layer coil conductor that is located inside a ceramic layer so as not to extend beyond the thickness of the ceramic layer and making a connecting portion to allow series connection between the surface coil conductor and the intra-layer coil conductor, the above described coil conductors having more than one turn for one ceramic layer can be easily realized.

In the case described above, when the intra-layer coil conductor is arranged so as to extend through the ceramic layer in the direction of the thickness of the ceramic layer and in order such that the surface coil conductor and the intra-layer coil conductor are electrically insulated from each other except for the connecting portion, the surface coil conductor and the intra-layer coil conductor are located at positions different in a main-surface direction of the ceramic layers, a situation in which coil conductors are concentrated at one point can be eased. Thus, cracking of a component body and breaking of a coil conductor that may occur in a firing step for producing a monolithic ceramic electronic component or displacement, deformation, and breaking of a coil conductor that may occur in a press-bonding step can be suppressed.

Furthermore, even in the case where the intra-layer coil conductor is arranged so as not to extend through the ceramic layer in the direction of the thickness of the ceramic layer and in order such that the surface coil conductor and the intra-layer coil conductor are electrically insulated from each other except for the connecting portion, an insulator is arranged over the intra-layer coil conductor and the insulator is arranged between the surface coil conductor and the intra-layer coil conductor, since the surface coil conductor and the intra-layer coil conductor are located in neighboring ceramic layers at positions different in the main-surface direction of the ceramic layers, the situation in which coil conductors are concentrated on one point can be eased, similarly to the case described above. Thus, cracking of a component body and breaking of a coil conductor that may occur in a firing step for producing a monolithic ceramic electronic component or displacement, deformation, and breaking of a coil conductor that may occur in a press-bonding step can be suppressed.

That which is claimed is:

1. A monolithic ceramic electronic component comprising a component body including a plurality of stacked ceramic layers and internal conductors arranged in association with specific layers of the ceramic layers, the internal conductors including coil conductors extending in a coil shape so as to be connected sequentially over the plurality of ceramic layers, wherein the coil conductors have more than one turn for the individual ceramic layers, wherein the coil conductors include surface coil conductors that are located along surfaces of the ceramic layers, intra-layer coil conductors each of which is located inside the respective ceramic layer so as not to extend beyond the thickness of the respective ceramic layer, and connecting portions that allow series connection between the surface coil conductors and the intra-layer coil conductors, wherein one of the intra-layer coil conductors extends through a respective ceramic layer in a thickness direction of the respective ceramic layer and along the same surface of the respective ceramic layer as the one of surface coil conductors, wherein the one surface coil conductor and the one intra-layer coil conductor are located at different positions on the same surface in a main-surface direction of the respective ceramic layer except for a respective connecting portion, and wherein the one intra-layer coil conductor includes an end edge portion positioned a spaced distance from the respective connecting portion in the main-surface direction and physically connected to a surface coil conductor formed on a ceramic layer adjacent to the respective ceramic layer, and the one intra-layer coil conductor further including an intermediate portion extending from the end edge portion toward the respective connecting portion in the main-surface direction, the intermediate portion further extending from the same surface of the respective ceramic layer to an opposite surface of the respective ceramic layer in the thickness direction, the intermediate portion including a cross-sectional extent in the thickness direction larger than a cross-sectional extent of the one surface coil conductor in the thickness direction.

2. The monolithic ceramic electronic component according to claim 1, wherein the intra-layer coil conductors are arranged so as to extend through the individual ceramic layers in a direction of the thickness of the ceramic layers, and wherein the surface coil conductors and the intra-layer coil conductors are located at positions different in the main-surface direction of the ceramic layers such that the surface coil conductors and the intra-layer coil conductors are electrically insulated from each other except for the connecting portions.

3. A monolithic ceramic electronic component comprising a component body including a plurality of stacked ceramic layers and internal conductors arranged in association with specific layers of the ceramic layers, the internal conductors including coil conductors extending in a coil shape so as to be connected sequentially over the plurality of ceramic layers, wherein the coil conductors have more than one turn for the individual ceramic layers, wherein the coil conductors include surface coil conductors that are located along surfaces of the ceramic layers, intra-layer coil conductors that are located inside the ceramic layers so as not to extend beyond the thickness of the individual ceramic layers, and connecting portions that allow series connection between the surface coil conductors and the intra-layer coil conductors, wherein the intra-layer coil conductors are arranged so as not to extend through the individual ceramic layers in a direction of the thickness of the ceramic layers, wherein in order such that the surface coil conductors and the intra-layer coil conductors are electrically insulated from each other except for the respective connecting portions, insulators arranged over the intra-layer coil conductors are further provided, the insulators are arranged between the surface coil conductors and the intra-layer coil conductors, and a surface coil conductor formed on one of neighboring two ceramic layers and an intra-layer coil conductor formed in the other one of the neighboring two ceramic layers are located at positions different in a main-surface direction of the ceramic layers, wherein the surface coil conductor of one of neighboring two ceramic layers and the intra-layer coil conductor of the other one of the neighboring two ceramic layers extend along a surface of the one of the neighboring two ceramic layers, and wherein the intra-layer coil conductor formed in the other one of the neighboring two ceramic layers includes an end edge portion positioned a spaced distance from the respective connecting portion in the main-surface direction and physically connected to the surface coil conductor formed on the one of neighboring two ceramic layers, and the intra-layer coil conductor further including an intermediate portion extending from the end edge portion toward the respective connecting portion in the main-surface direction, the intermediate portion including a cross-sectional extent in the thickness direction larger than a cross-sectional extent of the surface coil conductor in the thickness direction.

4. The monolithic ceramic electronic component according to claim 1, wherein the ceramic layers include, as one of the coil conductors, a coil conductor in which only a surface coil conductor that is located along a surface of a ceramic layer is provided.

5. The monolithic ceramic electronic component according to claim 1, wherein the ceramic layers include, as one of the coil conductors, a coil conductor in which only an intra-layer coil conductor that is located inside a ceramic layer so as not to extend beyond the thickness of the ceramic layer is provided.

6. The monolithic ceramic electronic component according to claim 1, further comprising an external conductive film that is formed on an outer surface of the component body; and a surface mount electronic component that is mounted on the outer surface of the component body so as to be connected to the external conductive film.

7. The monolithic ceramic electronic component according to claim 1, further comprising connection conductors that are led to outer surfaces of the component body so as to be connected to the internal conductors; and external terminal electrodes that are formed on the outer surfaces of the component body so as to be connected to the connection conductors.

8. The monolithic ceramic electronic component according to claim 1, wherein the intermediate portion of the intra-layer coil conductor is free from contact with the surface coil conductor formed on the specific ceramic layer and the surface coil conductor formed on the adjacent ceramic layer at the same surface and the opposite surface in the thickness direction.

* * * * *